United States Patent
Kanamoto et al.

(10) Patent No.: US 6,442,740 B1
(45) Date of Patent: Aug. 27, 2002

(54) CLOCK SIGNAL ANALYSIS DEVICE AND CLOCK SIGNAL ANALYSIS METHOD

(75) Inventors: Toshiki Kanamoto; Yasunori Shibayama, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/437,407

(22) Filed: Nov. 10, 1999

(30) Foreign Application Priority Data

Jun. 30, 1999 (JP) .......................................... 11-186154

(51) Int. Cl.$^7$ .............................................. G06F 17/50
(52) U.S. Cl. ............................................. 716/6; 703/16
(58) Field of Search ...................... 716/1–21; 703/14–16

(56) References Cited

U.S. PATENT DOCUMENTS

| | | | |
|---|---|---|---|
| 4,628,471 A | * 12/1986 | Schuler et al. ................. | 703/14 |
| 4,907,180 A | * 3/1990 | Smith .......................... | 703/14 |
| 5,043,920 A | 8/1991 | Malm et al. | |
| 5,463,563 A | * 10/1995 | Bair et al. ..................... | 716/11 |
| 5,550,760 A | * 8/1996 | Razdan et al. ................. | 703/14 |
| 5,553,008 A | * 9/1996 | Huang et al. .................. | 703/14 |
| 5,555,201 A | * 9/1996 | Dangelo et al. ............... | 716/1 |
| 5,754,826 A | * 5/1998 | Gamal et al. .................. | 703/14 |
| 5,784,593 A | * 7/1998 | Tseng et al. ................... | 703/15 |
| 5,831,864 A | * 11/1998 | Raghunathan et al. ......... | 716/2 |
| 6,014,510 A | * 1/2000 | Burks et al. ................... | 703/19 |
| 6,185,723 B1 | * 2/2001 | Burks et al. ................... | 703/14 |
| 6,195,786 B1 | * 2/2001 | Raghunathan et al. ......... | 716/2 |

FOREIGN PATENT DOCUMENTS

| | | | |
|---|---|---|---|
| JP | 6-18617 | 1/1994 | ........... G01R/31/28 |
| JP | 6-18619 | 1/1994 | ........... G01R/31/28 |
| JP | 6-275719 | 9/1994 | ........... H01L/21/82 |
| JP | 408287135 A | * 11/1996 | ........... G06F/17/50 |
| JP | 10-223765 | 8/1998 | ........... H01L/21/82 |
| JP | 411096206 A | * 4/1999 | ........... G06F/17/50 |

OTHER PUBLICATIONS

NN8206138 ("Logical, Device Level Simulation of MOS Networks", IBM Technical Disclosure Bulletin, vol. 25, No. 1, Jun. 1982, pp. 138–145 (pp. 1–7).*

Visweswariah ("Optimization techniques for high–performance digital circuits", 1997 IEEE/ACM International Conference on Computer–Aided Design, Nov. 9, 1997, pp. 198–207).*

Casas et al. ("Logic verification of very large circuits using Shark", Proceedings of the Twelfth International Conference on VLSI Design, Jan. 7, 1999, pp. 310–317).*

Razdan et al. ("Clock suppression techniques for synchronous circuits", IEEE Transactions on Computer–Aided Design of Integrated Circuits and Systems, vol. 12, No. 10, Oct. 1993, pp. 1547–1556).*

Sayah, J.Y., inter alia: "Design Planning for High–Performance ASIC's", IBM J. Res. Develop. vol. 40, No. 4, Jul. 1996, pp. 431–452.

Dartu, F., Pileggi, L.T.: TETRA: "Transistor–Level Engine for Timing Analysis", DCA 98, pp. 595–598, Jan. 1998.

* cited by examiner

Primary Examiner—Matthew Smith
Assistant Examiner—Phallaka Kik
(74) Attorney, Agent, or Firm—Burns, Doane, Swecker & Mathis, LLP

(57) ABSTRACT

A clock signal analysis device (100, 200, 300) has a pre-processing section (4) for reading circuit connection information, transistor characteristic information, and control information stored in memories (1, 2, 3) and for editing those information to be used for a simulation by a simulation execution section (5). The simulation execution section (5) executes a simulation of circuit operation, and then an after-processing section (6) calculates a delay value from a clock signal input node to a clock signal terminal node, a difference between delay values of clock signal terminal nodes, a rising time, a falling time of the clock signal and displays an analysis result by using a two-dimensional distribution map through a monitor (8).

15 Claims, 13 Drawing Sheets

40 TERMINAL NODE

CLOCK BUFFER
IN FIRST STAGE

STEP 1

STEP 2

50 INPUT NODE
FOR CLOCK SIGNAL

STEP 1

STEP 2

↓ STEP 1

71 INTERMEDIATE NODE

NET A   NET B   NET C   NET D

72 INTERMEDIATE NODE

40 TERMINAL NODE
81
82

CLOCK SIGNAL ANALYSIS DEVICE AND CLOCK SIGNAL ANALYSIS METHOD

BACKGROUND OF THE INVENTION

1. Field of the Invention

The present invention relates to a clock signal analysis device and a clock signal analysis method for analyzing delay values and clock skew values in clock signal transfer sections in a semiconductor integrated circuit while a layout pattern of the semiconductor integrated circuit is designed.

2. Description of the Related Art

Firstly, a RC extraction program is executed in order to extract circuit connection information from a layout pattern of the semiconductor integrated circuit during the analysis operation for delay values and skew values at clock signal transfer sections in the semiconductor integrated circuit. After this extraction process, a simulation must be executed by a circuit simulator.

However, because there are enormous number of parasitic resistances and parasitic capacitors in the extracted circuit connection information and a clock signal is provided to several thousands of circuit elements, it is impossible to detect and then edit signal termination nodes by hands.

Thus, because the analysis of the clock signal during the conventional design for the semiconductor integrated circuit is performed based on the above manner, it is almost impossible to detect signal termination nodes and to process the detected nodes by hands because there are enormous number of parasitic resistances and parasitic capacitors in the extracted circuit connection information.

Furthermore, the conventional analysis can not obtain supplemental information to trace a connection relationship of a clock buffer and to know a presence of a position having a large delay value and a large skew value in an actual layout pattern of the semiconductor integrated circuit in order to improve the delay values and the skew values in the clock signal transfer section based on the analysis result of the simulation. Because of this conventional drawback, the analysis result of the simulation can not be adequately used for improving the design of the semiconductor integrated circuit.

SUMMARY OF THE INVENTION

Accordingly, an object of the present invention is, with due consideration to the drawbacks of the conventional technique, to provide a clock signal analysis device and a clock signal analysis method capable of efficiently executing the analysis of delay values and skew values in a layout pattern of a semiconductor integrated circuit, and providing supplemental information showing positions having a large delay value and a large skew value. Thereby, the clock signal analysis device and the clock signal analysis method according to the present invention are capable of reducing a design time of the semiconductor integrated circuit.

In accordance with a preferred embodiment of the present invention, a clock signal analysis device comprises first memory means for storing circuit connection information including transistor information and net information, the transistor information comprising logical gates such as clock buffers and the net information comprising parasitic resistances and parasitic capacities of wires among transistors to be used during analysis for delay/skew values in clock signal propagation paths in a semiconductor integrated circuit, second memory means for storing transistor characteristic information to be used during a simulation for circuit operation of the semiconductor integrated circuit, third memory means for storing control information to be used for controlling an execution of the analysis of delay/skew values, pre processing means for inputting the circuit connection information stored in the first memory means, the transistor characteristic information stored in the second memory means, the control information stored in the third memory means, and for editing the circuit connection information, the transistor characteristic information, and the control information, simulation execution means for inputting the edited information transferred from the pre processing means and for executing the simulation of circuit operation of the semiconductor integrated circuit by using a circuit simulator and a switch level simulator, and after processing means for inputting simulation results transferred from the simulation execution means, and for calculating a delay value of each clock signal terminal node from each clock signal input node, a skew value as a different between the delay values of the clock signal terminal nodes, a rising time of the clock signal, and a falling time of the clock signal, and for transferring the calculated delay values, the skew values, the rising time, and the falling time as simulation analysis results in order to display the simulation analysis results on display means. In the clock signal analysis device, the pre processing means edits the circuit connection information into an usable state for the simulation, and the after processing means displays the simulation analysis results executed by the simulation means on a two-dimensional distribution map through the display means.

In the clock signal analysis device as another preferred embodiment of the present invention, the pre processing means makes connection information comprising the circuit connection information other than the parasitic resistances and the parasitic capacities based on the circuit connection information including the transistor information comprising the logical gates such as clock buffers and the net information comprising the parasitic resistances and the parasitic capacities of the wires among the transistors stored in the first memory means, and decides all of clock signal terminal nodes by searching a clock signal propagation path from a starting net to which the clock signal is inputted to a following net in order through logical gates including inverters, clocked inverters, and optional logical gates.

In the clock signal analysis device as another preferred embodiment of the present invention, the pre processing means searches and decides un-necessary transistors connected to the starting net in the circuit connection information including the transistor information comprising the logical gates such as clock buffers and the net information comprising the parasitic resistances and the parasitic capacities of the wires among the transistors stored in the first memory means, and then eliminates the un-necessary transistors from the circuit connection information. In the clock signal analysis device, the pre processing section shorts all of nodes that do not connect other circuit elements in order to generate a clock signal input node.

In the clock signal analysis device as another preferred embodiment of the present invention, the pre processing means makes connection information comprising the circuit connection information other than the parasitic resistances and the parasitic capacities based on the circuit connection information including the transistor information comprising the logical gates such as clock buffers and the net information comprising the parasitic resistances and the parasitic capacities of the wires among the transistors stored in the first memory means, and displays a configuration of the logical gates in the clock signal propagation paths on the display means.

In the clock signal analysis device as another preferred embodiment of the present invention, the pre processing means decides that gate terminals of transistor connected to a designated net are clock signal intermediate nodes based on the circuit connection information including the transistor information comprising the logical gates such as clock buffers and the net information comprising the parasitic resistances and the parasitic capacities of the wires among the transistors stored in the first memory means, and the pre processing means then calculates a delay value from the clock signal input node to the clock signal terminal node, and a difference between the clock signal intermediate nodes.

In the clock signal analysis device as another preferred embodiment of the present invention, in the circuit connection information including the transistor information comprising the logical gates such as clock buffers and the net information comprising the parasitic resistances and the parasitic capacities of the wires among the transistors stored in the first memory means, the pre processing means replaces a transistor whose gate terminal is connected to the clock signal termination node with a capacitor located between the clock signal termination node and a ground.

In the clock signal analysis device as another preferred embodiment of the present invention, in the circuit connection information including the transistor information comprising the logical gates such as clock buffers and the net information comprising the parasitic resistances and the parasitic capacities of the wires among the transistors stored in the first memory means, the pre processing means connects a gate terminal of a transistor that is not connected to any optional node to a power source or a ground in order to eliminate a floating node.

In the clock signal analysis device as another preferred embodiment of the present invention, in the circuit connection information including the transistor information comprising the logical gates such as clock buffers and the net information comprising the parasitic resistances and the parasitic capacities of the wires among the transistors stored in the first memory means, the pre processing means connects a source terminal or a drain terminal of a transistor that is not connected to any optional node to a power source or a ground in order to eliminate a floating node.

In the clock signal analysis device as another preferred embodiment of the present invention, the pre processing means obtains a minimum coordinate and a maximum coordinate in coordinate information for all nodes involved in the circuit connection information, calculates virtual lattice points as virtual lattice coordinates by dividing a length between the minimum coordinate and the maximum coordinate into equal length, and decides nodes that are the nearest point to the virtual lattice points as observation points, and pre processing means classifies delay values and skew values from the clock signal input node to the observation nodes per optional length, and then makes a two-dimensional distribution map by coloring color codes per optional length, and displays the two-dimensional distribution map through the display means in order to reduce an amount of a used resource during a simulation for the nodes having the coordinates that are the nearest nodes to the virtual lattice points.

In the clock signal analysis device as another preferred embodiment of the present invention, the pre processing means displays the clock signal propagation paths of the wiring from the clock signal input node to the clock signal termination nodes by using all of coordination information through the display means.

The clock signal analysis device as another preferred embodiment of the present invention, further comprises a fourth memory. In the clock signal analysis device, the after processing means writes a minimum value, a maximum value, a mean value of each of calculated delay values, skew values, rising time, and falling time, and a statistic results of them into the fourth memory means.

In the clock signal analysis device as another preferred embodiment of the present invention further comprises layout pattern generation means. In the clock signal analysis device, the layout pattern generation means receives delay values and skew values that have been calculated in order to improve the delay values and the skew values in the clock signal propagation paths based on the minimum value, the maximum value, and the mean value of each of the delay values, the skew values, the rising time, and the falling time stored in the fourth memory means by the after processing means, and wherein the layout pattern generation means generates a layout pattern of the semiconductor integrated circuit based on the delay value and the skew value that have been back annotated.

In the clock signal analysis device as another preferred embodiment of the present invention, the pre processing means decides all of nodes involved in a designated net as observation nodes based on the circuit connection information including the transistor information comprising the logical gates such as clock buffers and the net information comprising the parasitic resistances and the parasitic capacities of the wires among the transistors stored in the first memory means. In the clock signal analysis device, the after processing means calculates a delay value per unit length for each of the parasitic resistances based on a difference of the delay values between both terminal nodes of the designated net and the coordinate values of the both terminal nodes, searches the connection information along clock signal propagation paths in the designated net involved in the circuit connection information, checks and extracts coordinates at which the delay value per unit length of the parasitic resistance is changed over an optional allowed value, and displays the extracted coordinates through the display means.

In accordance with another preferred embodiment of the present invention, a clock signal analysis method comprising the steps of a first memory step for storing circuit connection information including transistor information and net information, the transistor information comprising logical gates such as clock buffers and the net information comprising parasitic resistances and parasitic capacities of wires among transistors to be used during analysis for delay/skew values in clock signal propagation paths in a semiconductor integrated circuit, a second memory step for storing transistor characteristic information to be used during a simulation for circuit operation of the semiconductor integrated circuit, a third memory step for storing control information to be used for controlling an execution of the analysis of delay/skew values, a pre processing step for inputting the circuit connection information, the transistor characteristic information, the control information, and for editing the circuit connection information, the transistor characteristic information, and the control information, a simulation execution step for inputting the edited information obtained from the pre processing step and for executing the simulation of circuit operation of the semiconductor integrated circuit by using a circuit simulator and a switch level simulator, and an after processing step for inputting simulation results obtained from the simulation execution step, and for calculating a delay value of each clock signal terminal node from each clock signal input node, a skew value as a different between the delay values of the clock signal terminal nodes, a rising time of the clock signal, and a falling time of the clock signal, and for transferring the calculated delay values, the skew values, the rising time, and the falling time as simulation analysis results in order to display the simulation analysis results. In the clock signal analysis method, the pre processing step edits the circuit connection information into an usable state for the simulation, and the after processing step displays the simulation analysis results obtained by the simulation step on a two-dimensional distribution map through a display step.

The clock signal analysis method as another preferred embodiment of the present invention further comprises the steps of a fourth memory step for storing a minimum value, a maximum value, a mean value of each of the delay values, the skew values, the rising time and the falling time, and the statistic values of them, and a layout pattern generation step for generating a layout pattern of the semiconductor integrated circuit based on the information obtained from the fourth memory step in order to improve the delay values and the skew values of the clock signal propagation paths based on the delay values and the skew values that have been back annotated.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

First Embodiment

Figure 1:
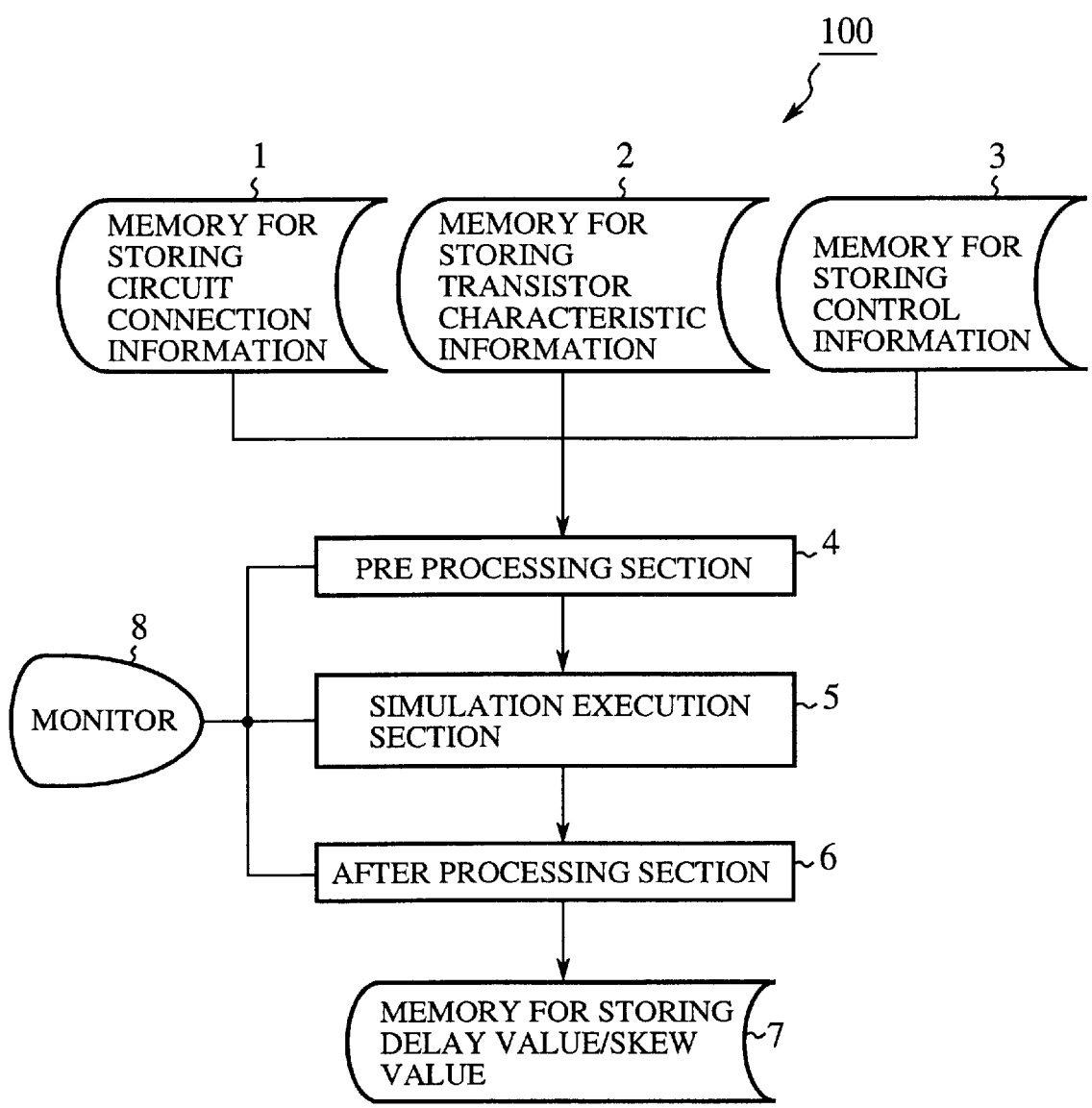
FIG. 1 is a block diagram showing a configuration of the clock signal analysis device according to the first to tenth embodiments of the present invention.
Figure 2:
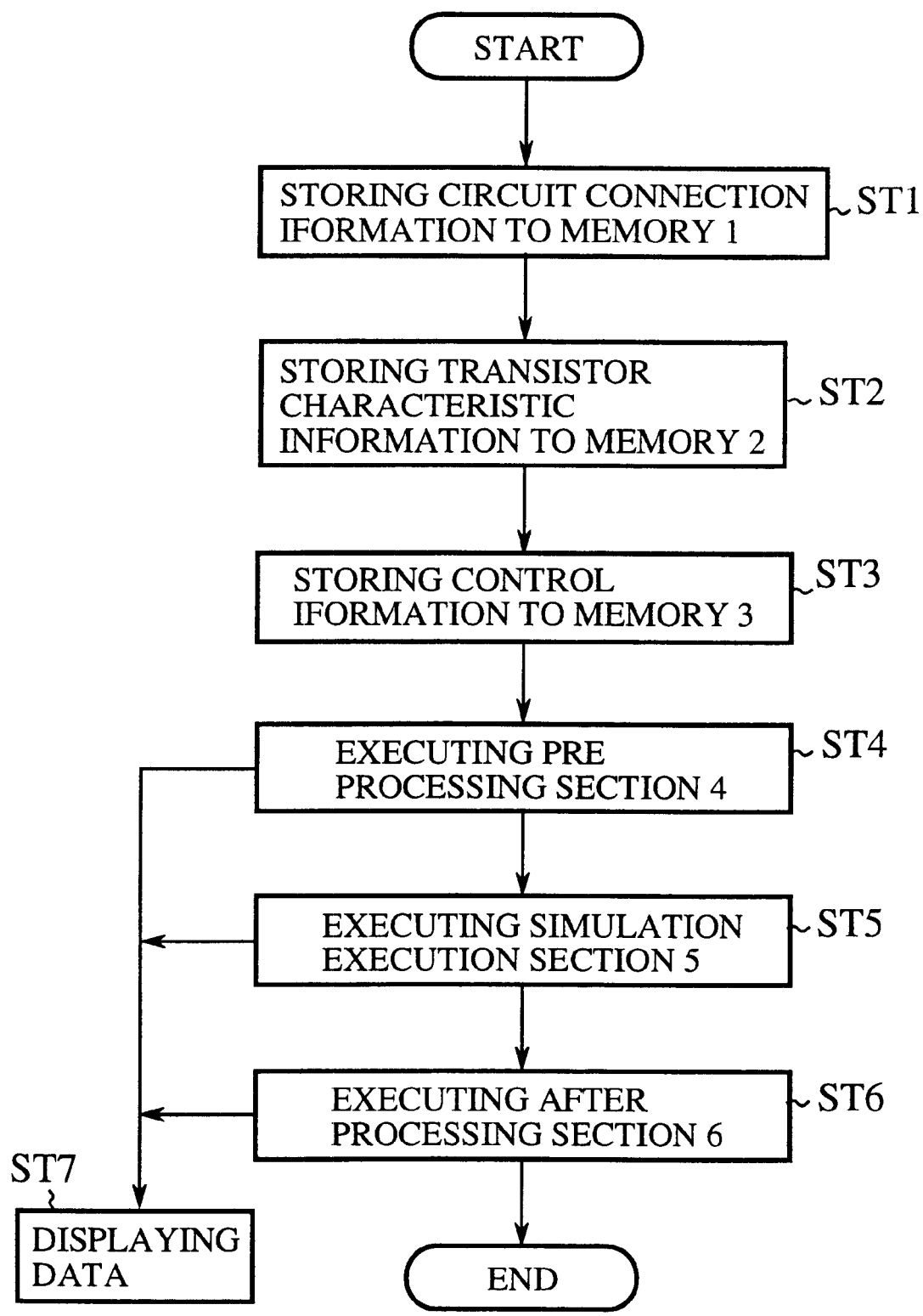
FIG. 2 is a flow chart showing the operation of the clock signal analysis device according to the first embodiment of the present invention.

FIG. 1 is a block diagram showing a configuration of a clock signal analysis device according to the first to tenth embodiments of the present invention, and FIG.2 is a flow chart showing the operation of the clock signal analysis device according to the present invention.

In FIG. 1, the reference number 1 designates a memory for storing circuit connection information including transistor information and net information (Step ST1 shown in FIG. 2). The transistor information includes clock buffers by which logical gates are formed. The net information includes parasitic resistances and parasitic capacitors in wiring between transistors. The reference number 2 denotes a memory for storing transistor characteristic information (Step ST2 shown in FIG. 2) to be used for executing simulation of circuit operation (Step ST5 shown in FIG. 2). The reference number 3 indicates a memory for storing control information (Step ST3 shown in FIG. 2) to be used for controlling the execution of the analysis of the delay values and skew values.

The reference number 4 designates a pre processing section for inputting the circuit connection information stored in the memory 1, the transistor characteristic information stored in the memory 2, and the control information stored in the memory 3, and then editing those information (Step ST4 shown in FIG. 2). The reference number 5 designates a simulation execution section comprising a circuit simulator, a switch level logical simulator and the like for executing the simulation of circuit operation (Step ST5 shown in FIG. 2). The reference number 6 designates an after processing section for calculating a delay value between a clock signal input node and a clock signal termination node, a rising time, and a falling time (Step ST6 shown in FIG. 2) based on the simulation result obtained from the simulation execution section 5. The after processing section 6 then outputs calculated delay values and skew values to a memory 7 (Step ST6 shown in FIG. 2). The reference number 7 denotes the memory described above for storing the delay values and the skew values transferred from the after processing section 6. The reference number 8 indicates a monitor 8 for displaying information to designers (Step ST7 shown in FIG. 2).

The clock signal analysis device 100 of the present invention comprises the pre processing section 4, the simulation execution section 5, the after processing section 6, the memories 1, 2, 3, and 7, and the monitor 8.

Next, a description will be given of the operation of the clock signal analysis device 100 with referring to the flow chart shown in FIG. 2.

Figure 3:
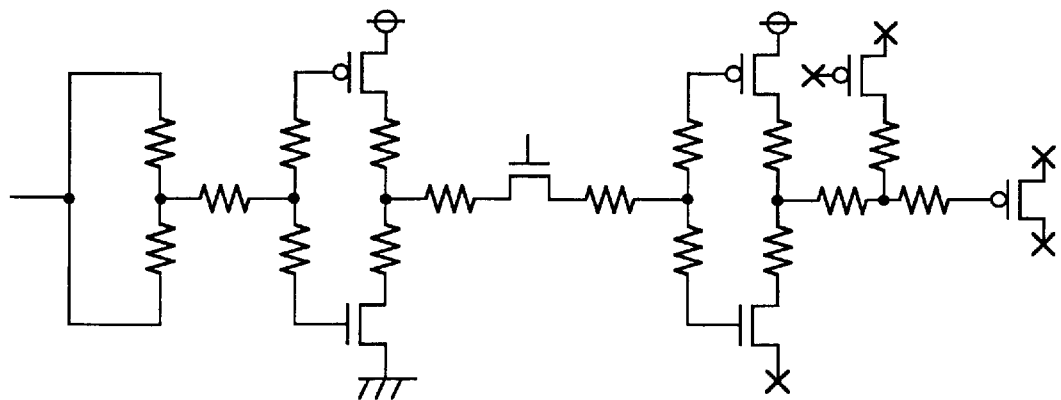
FIG. 3 is a circuit diagram showing circuit connection information.

FIG. 3 is a circuit diagram showing the circuit connection information. In FIG. 3, the reference symbol X designates a floating node. In the normal operation, the circuit connection information in the layout pattern of the semiconductor integrated circuit are described by using an ASC II code file as represented by a SPICE net list.

In recent years, there is a standard in a management group of OVI (Open Verilog International) in which coordinate information of each node, net information including extracted parasitic resistances and parasitic capacitors are described in comment lines in the SPICE net list. The coordinate information of each node, the net information including extracted parasitic resistances and parasitic capacitors are stored in the memories 1, 2, and 3 in Steps 1 to 3.

Figure 4:
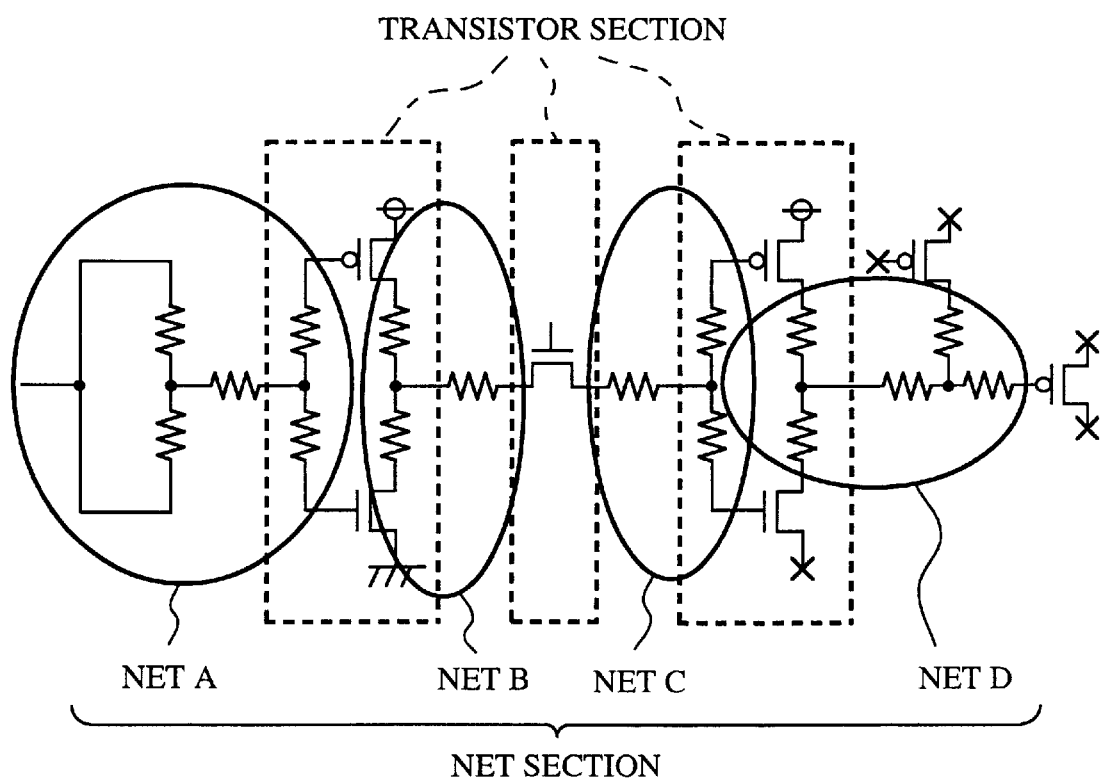
FIG. 4 is a diagram showing a configuration of a Standard Parasitic Format (SPF)
Figure 5A:
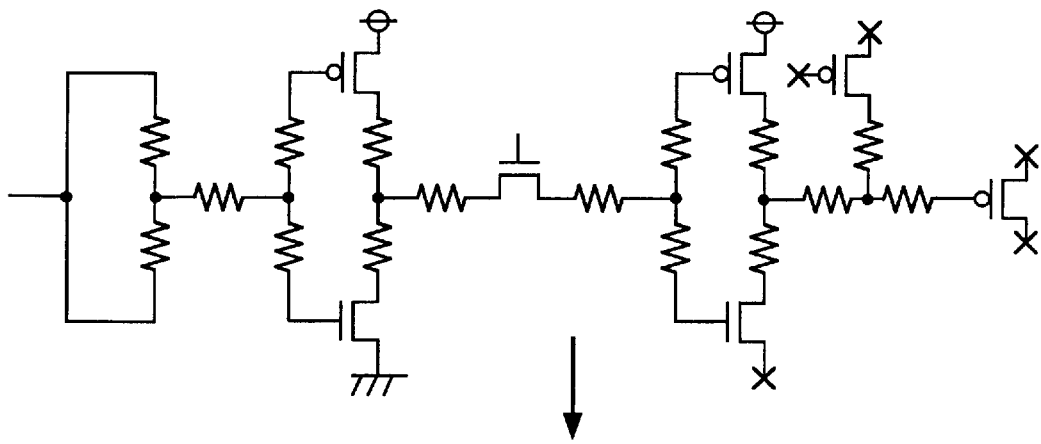
FIGS. 5A, 5B, and 5C are diagrams showing a clock signal termination node obtained by a decision processing performed by a pre processing section incorporated in the clock signal analysis device of the first embodiment of the present invention.
Figure 5B:
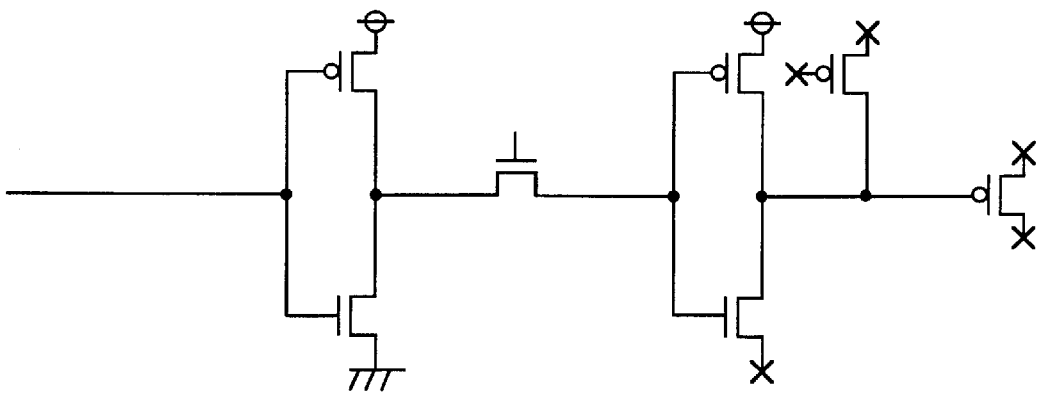
Figure 5C:
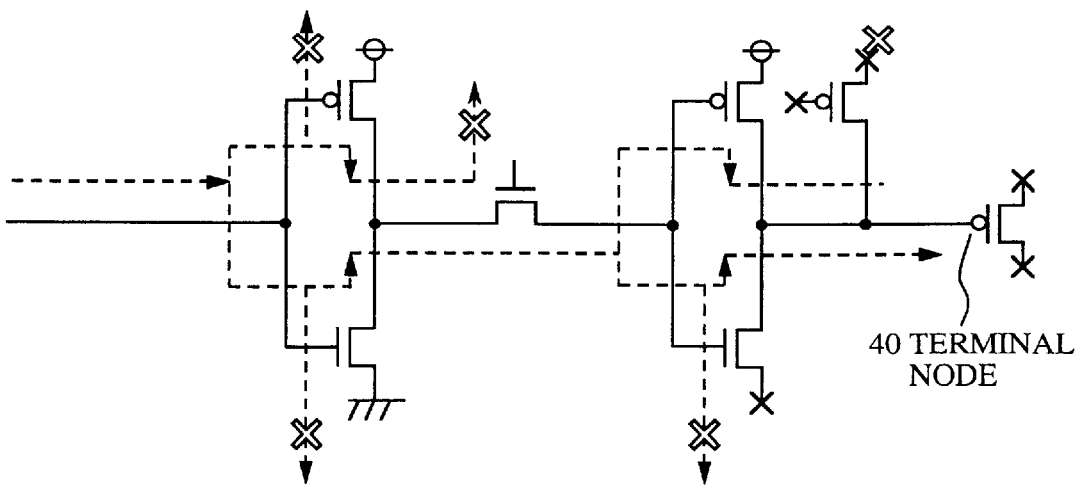

FIG. 4 is a diagram showing a configuration of the Standard Parasitic Format (SPF). FIGS. 5A, 5B, and 5C are diagrams showing a clock signal termination node obtained by the decision processing performed by the pre processing section 4 incorporated in the clock signal analysis device 100 of the first embodiment of the present invention. In FIGS. 5A, 5B, and 5C, the white reference symbol X is a floating connection point and a small reference symbol X is the floating nodes as shown in FIGS. 3 and 4.

The pre processing section 4 in the clock signal analysis device 100 shown in FIG. 1 detects all of clock signal termination nodes in the order shown in FIGS. 5A, 5B, and 5C. The detected clock signal termination nodes are transferred to the monitor 8 in order to display the detected clock signal termination nodes (Step ST7). That is to say, the connection information are made by extracting the parasitic resistances and the parasitic capacitors from the circuit connection information stored in the memory 1 (see FIG. 5A and Step ST4 shown in FIG. 2). Then, as shown in FIG. 5B, the search for the transfer path is executed from a net indicating the start point of the clock signal to a following net through a transistor section (Step ST5).

FIG. 5B shows the state where the parasitic resistance and the parasitic capacitor in wiring between transistors are extracted.

The conditions for the path search shown in FIG. 5B executed by the pre processing section 4 in the clock signal analysis device 100 are as follows:

(1) The search is performed from a gate of a transistor to source/drain of a transistor, or source/drain of a transistor to drain/source of the transistor;

(2) It is analyzed whether the source/drain of the transistor is connected to a power source supply or a ground, and the path search processing halts when the source/drain is a floating node; and (3) When the source and the drain nodes are the floating node (designated by the reference symbol X), the corresponding gate node is decided as a clock signal termination node 40.

As a result of the path search operation described above, The clock signal termination node 40 at which a delay value and a skew value must be observed are automatically decided (step ST6) by the clock signal analysis device 100 according to the first embodiment of the present invention. Thereby, it is possible to avoid any occurrence of mistakes to be caused by hands.

As described above, in the clock signal analysis device and the clock signal analysis method according to the first embodiment of the present invention, the circuit connection information including the parasitic resistances and the parasitic capacitors, the transistor characteristic information, and the control information are stored to the memory 1, the memory 2, and the memory 3, respectively. The pre processing section 4 in the clock signal analysis device 100 performs the path search in the layout pattern of the semiconductor integrated circuit in order to decide the position of the clock signal termination node 40. It is thereby possible to automatically detect the position of the clock signal termination node 40 that requires the observation of the delay value and the skew value. When compared with the conventional method in which elements and floating nodes that are not required for the execution of the simulation are detected by hands, the clock signal analysis device and the clock signal analysis method of the first embodiment can reduce the design time of the semiconductor integrated circuit and avoid any occurrence of mistakes caused by hands.

Second Embodiment

Figure 6A:
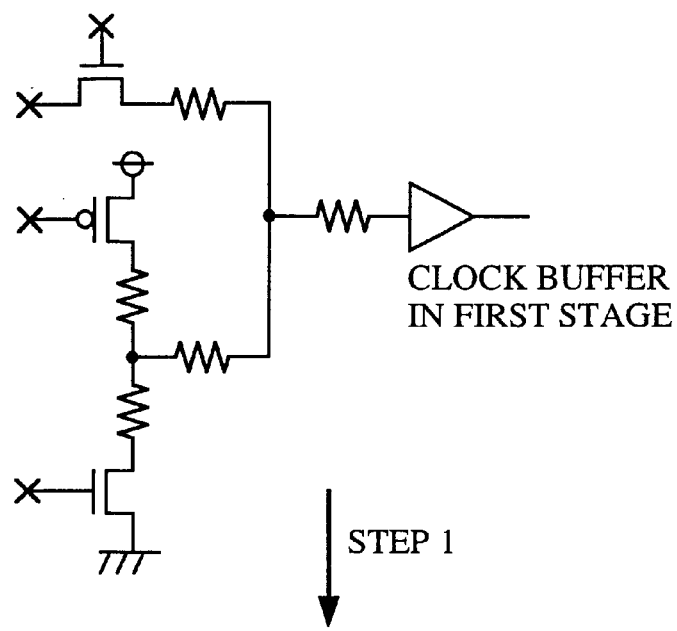
FIGS. 6A, 6B, and 6C are diagrams showing a clock signal input node obtained by an edition processing performed by the clock signal analysis device according to the second embodiment of the present invention.
Figure 6B:
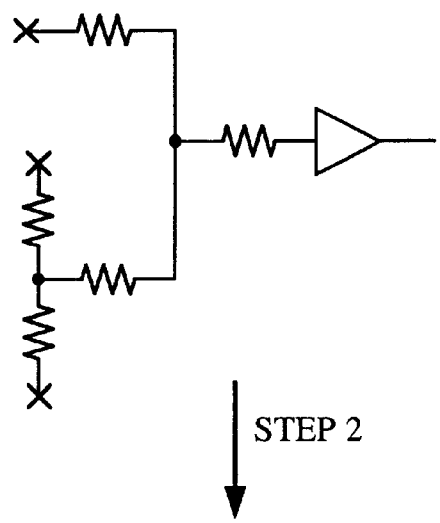
Figure 6C:
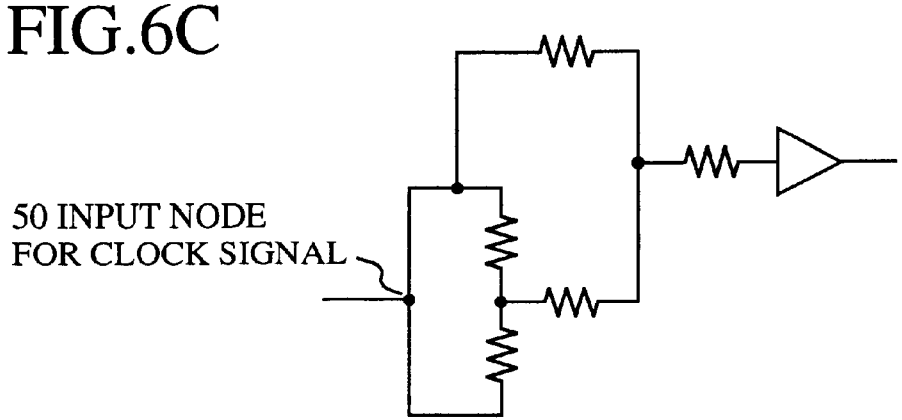

FIGS. 6A, 6B, and 6C are diagrams showing a clock signal input node obtained by an edition processing for a clock signal input node performed by the clock signal analysis device according to the second embodiment of the present invention. The configuration of the clock signal analysis device according to the second embodiment is the same as that of the first embodiment, therefore the same reference numbers are used and the explanation for them is omitted here.

Next, a description will be given of the operation of the clock signal analysis device according to the second embodiment.

The pre processing section 4 in the clock signal analysis device 100 of the second embodiment performs the edit processing for a clock signal input node in the layout pattern of the semiconductor integrated circuit in order shown in FIGS. 6a, 6B, and 6C.

First, the pre processing section 4 checks whether or not one of a source terminal and a drain terminal in each of transistors connected to a net is connected to a power source or a ground or a floating node X. These transistors are included in the circuit connection information for the layout pattern of the semiconductor integrated circuit and are located at a start point to which the clock signal is inputted. Then the transistors are eliminated from the circuit connection information. FIG. 6B shows the state where the transistors have been eliminated based on the above processing.

Next, as shown in FIG. 6B, nodes that are not connected to another node are extracted. After this extraction process shown in FIG. 6B, the clock signal input node 50 is generated by shorting or connecting the extracted nodes (designated by the reference symbol X) to each other shown in FIG. 6C. Thereby, the clock signal input node 50 enters the executable state for the simulation.

As described above, in the second embodiment of the present invention, the pre processing section 4 in the clock signal analysis device 100 checks the presence of unnecessary transistors connected to the net to which the clock signal is firstly inputted, and then eliminated those transistors, and shorts the nodes that are not connected to other nets in order to generate the clock signal input node automatically. In this case, those unnecessary transistors have already been included in the information of the transistors such as clock buffers forming the logical gates and also included in the circuit connection information having the net information comprising the parasitic resistance and parasitic capacitors of wiring between the transistors. When compared with the conventional method in which elements and floating nodes that are not necessary for executing the simulation are detected by hands, the clock signal analysis device and the clock signal analysis method of the first embodiment can reduce the design time of the layout pattern of the semiconductor integrated circuit and avoid any occurrence of mistakes caused by hands.

Third Embodiment

Figure 7A:
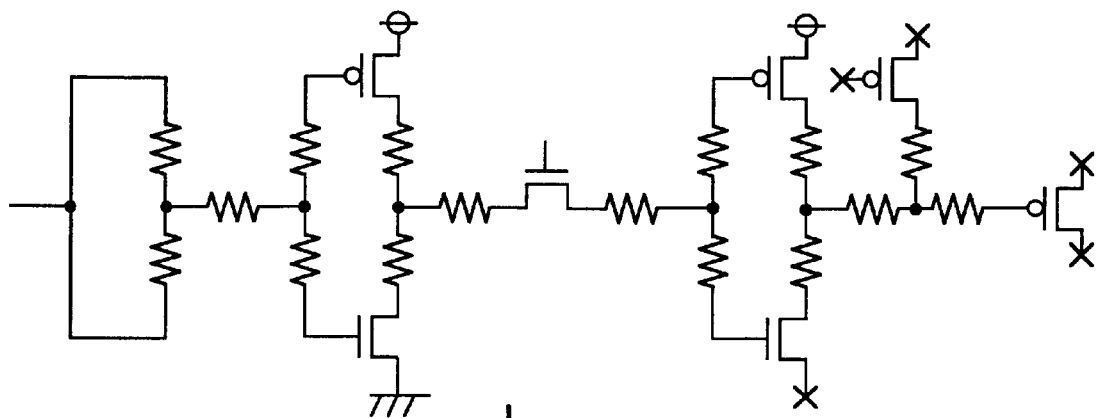
FIGS. 7A, 7B, and 7C are diagrams showing clock buffer configurations obtained by the clock signal analysis device according to the third embodiment of the present invention.
Figure 7B:
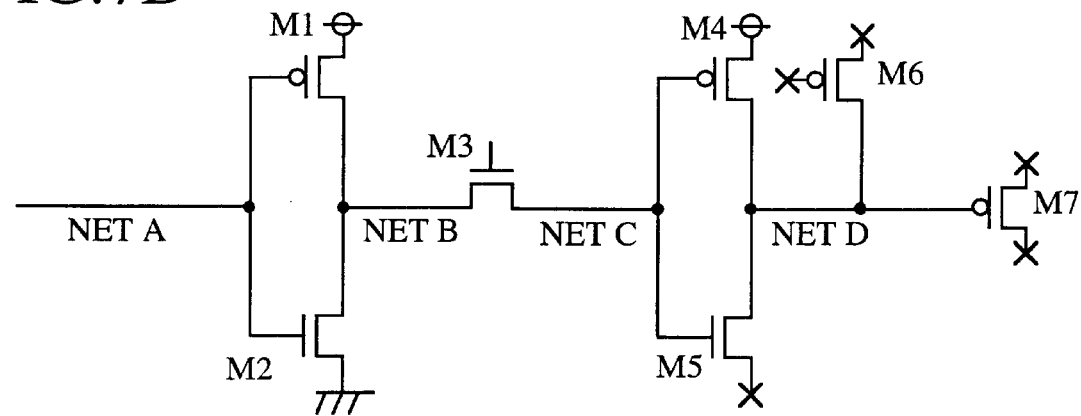
Figure 7C:
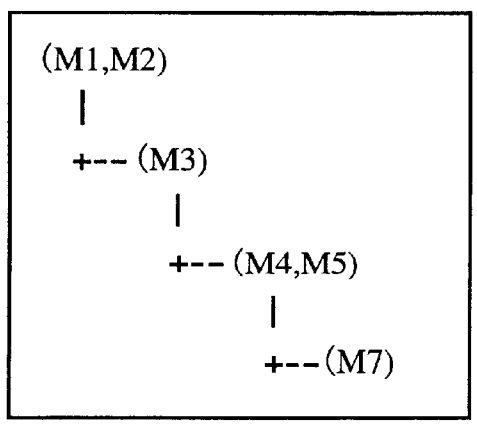

FIGS. 7A, 7B, and 7C are diagrams showing clock buffer configurations obtained by the clock signal analysis device according to the third embodiment of the present invention. The configuration of the clock signal analysis device according to the third embodiment is the same as that of the first embodiment, therefore the same reference numbers are used and the explanation for them is omitted here.

Next, a description will be given of the operation of the clock signal analysis device according to the third embodiment.

FIGS. 7A, 7B, and 7C show the configurations of clock buffers through which the clock signal is transferred.

First, as shown in FIG. 7A, the pre processing section 4 in the clock signal analysis device 100 reads the circuit connection information stored in the memory 1 for the layout pattern of the semiconductor integrated circuit and then makes the connection information except the parasitic resistances and the parasitic capacitors based on the circuit connection information that have been red.

Next, as shown in FIG. 7B, the transistors M1 to M7 among the nets A, B, C, and D are grouped per net in order to clearly show the connection relationship among the transistors M1 to M7. For example, the transistors M1 and M2 are located between the net A and the net B, and the transistor M3 is located between the net B and the net C. Therefore the connection relationship between the transistors M1 and M2 and the transistor M3 is shown in FIG. 7C. Users such as designer can observe this connection relationship shown in FIG. 7C through the monitor 8.

As described above, according to the third embodiment of the present invention, the pre processing section 4 in the clock signal analysis device 100 makes the connection information based on the circuit connection information stored in the memory 1. The circuit connection information contains the transistor information by which the logical gates such as the clock buffers are formed and the net information that contains the parasitic resistances and the parasitic capacitors in the wires connected among the transistors. The connection information do not contain the parasitic resistances and the parasitic capacitors. The pre processing section 4 shows the connection information to designers through the monitor 8. Thereby, the designers can clearly recognize the paths through which the clock signal is propagated and also trace the nodes having large delay values and skew values in the layout pattern of the semiconductor integrated circuit.

Fourth Embodiment

Figure 8A:
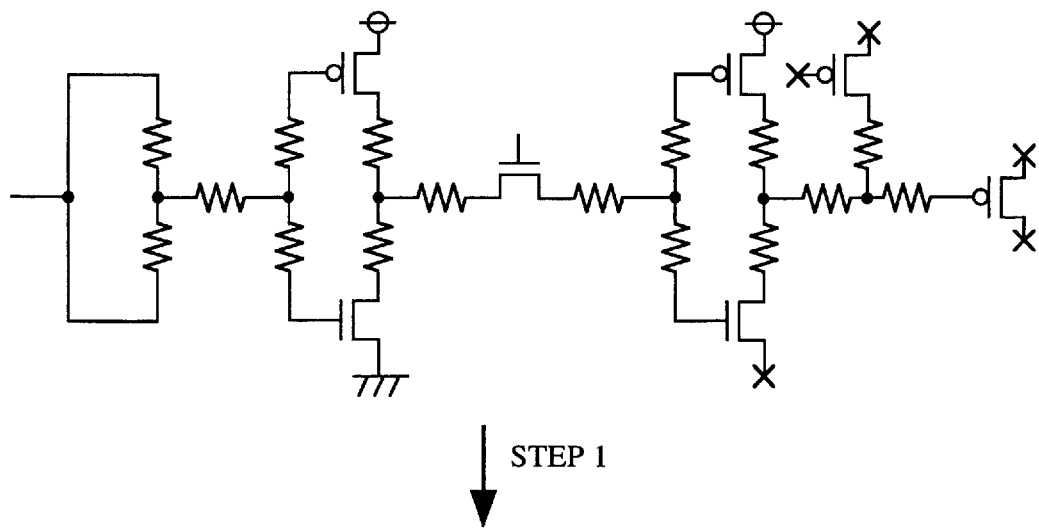
FIGS. 8A and 8B are diagrams showing clock signal intermediate nodes obtained by the decision processing performed by the clock signal analysis device according to the fourth embodiment of the present invention.
Figure 8B:
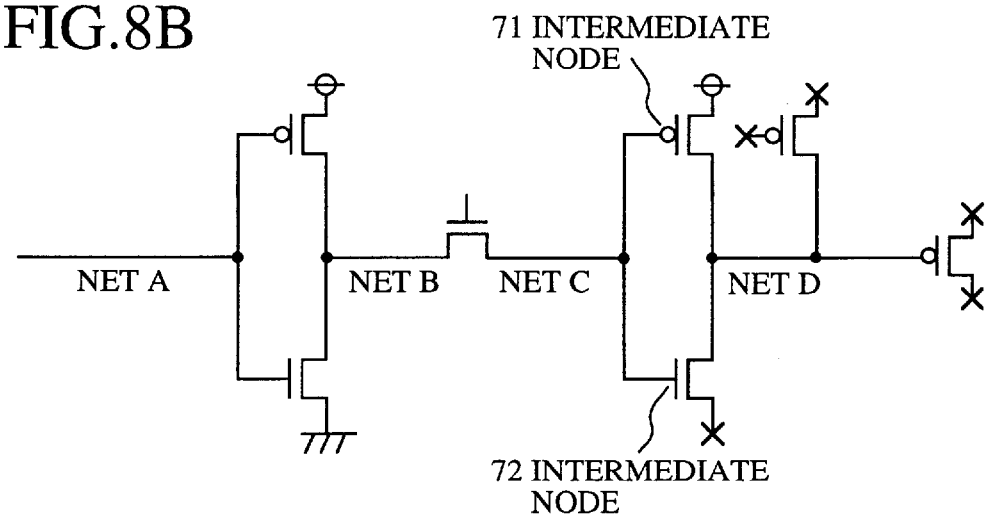

FIGS. 8A and 8B are diagrams showing clock signal intermediate nodes obtained by the decision processing for clock signal intermediate nodes performed by the clock signal analysis device according to the fourth embodiment of the present invention. The configuration of the clock signal analysis device according to the fourth embodiment is the same as that of the first embodiment, therefore the same reference numbers are used and the explanation for them is omitted here.

Next, a description will be given of the operation of the clock signal analysis device according to the fourth embodiment.

FIGS. 8A and 8B also show the state of the decision processing for deciding the positions of the clock signal intermediate nodes in order to calculate delay/skew values.

First, as shown in FIG. 8A, the pre processing section 4 in the clock signal analysis device 100 reads the circuit connection information stored in the memory 1 for the layout pattern of the semiconductor integrated circuit. Then, the pre processing section 4 makes the connection information except the parasitic resistances and the parasitic capacitors based on the circuit connection information that have been red.

Next, the pre processing section 4 checks all nodes in order to know whether or not a node connected to the gate terminal of each transistor is the clock signal intermediate node. As a result, the pre processing section 4 decides that the nodes 71 and 72 are the clock signal intermediate node. The pre processing section 4 calculates delay values of the paths from the clock signal input node to each of the clock signal intermediate nodes 71 and 72. Further, the pre processing section 4 calculates a skew value that is a difference of the delay values between the clock signal intermediate nodes 71 and 72.

As described above, according to the fourth embodiment of the present invention, the pre processing section 4 in the clock signal device 100 recognizes that the gate terminal of the transistor connected to the designated net (for example, the net C shown in FIG. 8B) is the clock signal intermediate node, and then calculates the delay values from the clock signal input node to the clock signal intermediate nodes and the skew value between the clock signal intermediate nodes based on the circuit connection information stored in the memory 1 that contain the transistor information by which the logical gates such as the clock buffers are formed and the net information that contain the parasitic resistances and the parasitic capacitors in the wires connected among the transistors. Accordingly, it is possible to calculate the delay values and the skew value about all of the nodes in the paths through which the clock signal is propagated by one processing of the pre processing section 4. The efficiency of the designer's works for designing the layout pattern of the semiconductor integrated circuit can be increased.

Fifth Embodiment

Figure 9:
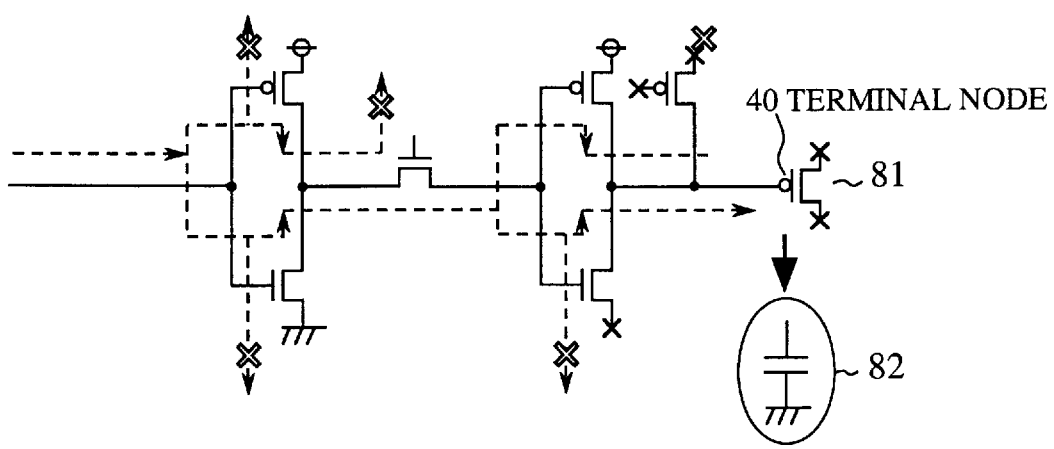
FIG. 9 is a diagram showing a connection state of a capacitor element obtained by a replacement processing performed by the clock signal analysis device according to the fifth embodiment of the present invention.

FIG. 9 is a diagram showing a connection state of a capacitor element obtained by a replacement process performed by the clock signal analysis device according to the fifth embodiment of the present invention. The configuration of the clock signal analysis device according to the fifth embodiment is the same as that of the first embodiment, therefore the same reference numbers are used and the explanation for them is omitted here.

Next, a description will be given of the operation of the clock signal analysis device according to the fifth embodiment.

First, as shown in FIG. 9, the pre processing section 4 in the clock signal analysis device 100 replaces the transistor 81 whose gate terminal is connected to the clock signal terminal node 40 obtained by the processing in the first embodiment with a capacitor element 82 placed between the terminal node 40 and the ground.

At this time, the pre processing section 4 reads the transistor characteristic information such as parameters in the SPICE model stored in the memory 2 and calculates the amount of the capacitor of the gate of the transistor 81 based on the transistor characteristic information that have been red. The calculated value of the capacitor is set to the value of the capacitor element 82 to be replaced. The pre processing section 4 writes the information regarding the capacitor element 82, with which the transistor 81 has been replaced, to the memory 1 in order to update the circuit connection information.

As described above, according to the fifth embodiment of the present invention, the pre processing section 4 in the clock signal analysis device 100 replaces the transistor 81 whose gate terminal is connected to the clock signal terminal node 40 with capacitor element 82 placed between the terminal node 40 and the ground based on the circuit connection information stored in the memory 1. The circuit connection information contains the transistor information by which the logical gates such as the clock buffers are formed and the net information contains the parasitic resistances and the parasitic capacitors in the wires connected among the transistors. Thereby, it is possible to eliminate the transistor 81 whose source/drain terminals are floating nodes, and to replace the transistor 81 with the capacitor element 82 as a simple load. Thereby it is possible to reduce the simulation time of the simulation performed by the simulation execution section 5.

Sixth Embodiment

Figure 10:
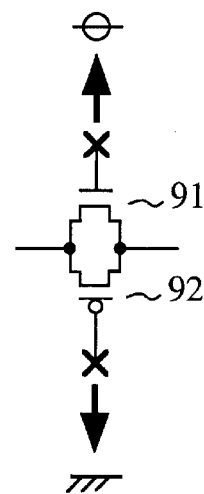
FIG. 10 is a diagram showing a connection state of gate terminals of PMOS and NMOS transistors obtained by a gate terminal processing performed by the clock signal analysis device according to the sixth embodiment of the present invention.

FIG. 10 is a diagram showing a connection state of gate terminals of PMOS and NMOS transistors 91 and 92 obtained by a gate terminal processing performed by the clock signal analysis device according to the sixth embodiment of the present invention. The configuration of the clock signal analysis device according to the sixth embodiment is the same as that of the first embodiment, therefore the same reference numbers are used and the explanation for them is omitted here.

Next, a description will be given of the operation of the clock signal analysis device according to the sixth embodiment.

First, as shown in FIG. 10, the pre processing section 4 in the clock signal analysis device 100 reads the circuit connection information stored in the memory 1 and extracts the transistors 91 and 92 whose gate terminals are not connected to any optional node. The pre processing section 4 further connects the gate terminals of the transistors 91 and 92 to the power source or the ground in order to eliminate the floating nodes.

The processing described above is executed by the pre processing section 4 based on the following conditions:

(1) When both the source terminal and the drain terminal of the NMOS transistor 91 are connected to optional nets, the gate terminal of the NMOS transistor 91 is connected to the power source; and (2) When both the source terminal and the drain terminal of the PMOS transistor 92 are connected to optional nets, the gate terminal of the PMOS transistor 92 is connected to the ground.

Next, the pre processing section 4 writes the connection information that have been changed into the memory 1 in order to update the circuit connection information.

As described above, according to the sixth embodiment of the present invention, the pre processing section 4 in the clock signal analysis device 100 connects the gates of the transistors 91 and 92, whose source and drain terminals are connected to optional nodes, to the power source or the ground in order to eliminate floating nodes based on the circuit connection information stored in the memory 1. The floating nodes are on the paths through which the clock signal is propagated. The above circuit connection information contains the transistor information by which the logical gates such as the clock buffers are formed and the net information contains the parasitic resistances and the parasitic capacitors in the wires connected among the transistors. Thereby, it is possible to perform the simulation by using the transistors 91 and 92 whose source/drain terminals are the floating nodes and it is possible to reduce design time for the layout pattern of the semiconductor integrated circuit when compared with the simulation time that is necessary for the conventional simulation method performed by hands. Further, the clock analysis device of the sixth embodiment can eliminate the occurrences of mistakes caused by hands.

Seventh Embodiment

Figure 11:
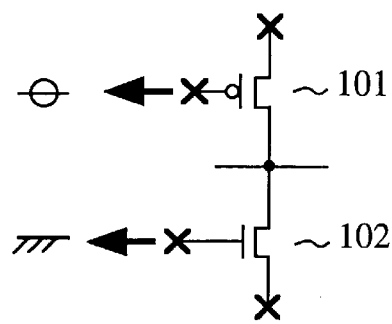
FIG. 11 is a diagram showing a connection state of gate terminals of PMOS and NMOS transistors obtained by a gate terminal processing performed by the clock signal analysis device according to the seventh embodiment of the present invention.

FIG. 11 is a diagram showing a connection state of gate terminals of PMOS and NMOS transistors 101 and 102 obtained by a gate terminal processing performed by the clock signal analysis device according to the seventh embodiment of the present invention. The configuration of the clock signal analysis device according to the seventh embodiment is the same as that of the first embodiment, therefore the same reference numbers are used and the explanation for them is omitted here.

Next, a description will be given of the operation of the clock signal analysis device according to the seventh embodiment.

First, as shown in FIG. 11, the pre processing section 4 in the clock signal analysis device 100 reads the circuit connection information stored in the memory 1 and then performs the processing that the gate terminals of the transistors 101 and 102 whose gate terminals is not connected to any optional node are connected to the power source or the ground in order to eliminate floating nodes.

The processing described above is executed by the pre processing section 4 based on the following conditions:

(1) When one of source and drain terminals of the PMOS transistor 101 is connected to a net and the other terminal is a floating node, the gate terminal of the PMOS transistor 101 is connected to the power source; and (2) When one of source and drain terminals of the NMOS transistor 102 is connected to a net and the other terminal is a floating node, the gate terminal of the NMOS transistor 102 is connected to the ground.

Next, the pre processing section 4 writes the connection information that have been changed into the memory 1 in order to update the circuit connection information.

As described above, according to the seventh embodiment of the present invention, the pre processing section 4 in the clock signal analysis device 100 connects the gates of the PMOS and NMOS transistors 101 and 102 (in the circuit connection information stored in the memory 1 and whose one of the source and drain terminals is connected to a node and the other is a floating node) to the power source or the ground in order to eliminate the floating nodes. The floating nodes are on the paths through which the clock signal is propagated. The above circuit connection information contains the transistor information by which the logical gates such as the clock buffers are formed and the net information contains the parasitic resistances and the parasitic capacitors in the wires connected among the transistors. Thereby, it is possible to perform the simulation of the layout pattern including the transistors 101 and 102 whose source or drain terminal is the floating node and it is possible to reduce design time for the layout pattern of the semiconductor integrated circuit when compared with the simulation time that is necessary for the conventional simulation method performed by hands. Further, the clock analysis device of the seventh embodiment can eliminate the occurrences of mistakes by hands.

Eighth Embodiment

Figure 12:
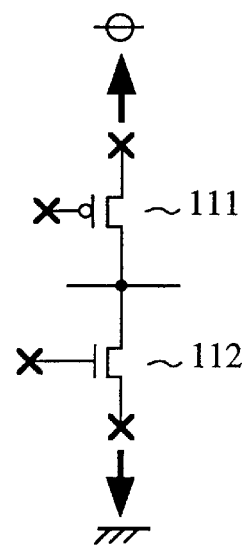
FIG. 12 is a diagram showing a connection state of source and drain terminals of PMOS and NMOS transistors obtained by a source and drain terminal processing performed by the clock signal analysis device according to the eighth embodiment of the present invention.

FIG. 12 is a diagram showing a connection state of source and drain terminals of PMOS and NMOS transistors 111 and 112 obtained by a source and drain terminal processing performed by the clock signal analysis device according to the eighth embodiment of the present invention. The configuration of the clock signal analysis device according to the eighth embodiment is the same as that of the first embodiment, therefore the same reference numbers are used and the explanation for them is omitted here.

Next, a description will be given of the operation of the clock signal analysis device according to the eighth embodiment.

First, as shown in FIG. 12, the pre processing section 4 in the clock signal analysis device 100 reads the circuit connection information stored in the memory 1. When the source terminal or the drain terminal (as floating nodes) of each of the PMOS and NMOS transistors 111 and 112 is not connected to any node, the pre processing section 4 connects the source terminal or the drain terminal of the PMOS and NMOS transistors 111 and 112 to the power source or the ground in order to eliminate the floating nodes.

The processing described above is executed by the pre processing section 4 based on the following conditions:

(1) When one of source and drain terminals of the PMOS transistor 111 is connected to a net and the other terminal is a floating node, the other terminal as the floating node of the PMOS transistor 111 is connected to the power source; and (2) When one of source and drain terminals of the NMOS transistor 112 is connected to a net and the other terminal is a floating node, the other terminal as the floating node of the NMOS transistor 112 is connected to the ground.

Next, the pre processing section 4 writes the connection information that have been changed into the memory 1 in order to update the circuit connection information.

As described above, according to the eighth embodiment of the present invention, the pre processing section 4 in the clock signal analysis device 100 connects the source terminal or the drain terminal of each of the PMOS and NMOS transistors 101 and 102 (in the circuit connection information stored in the memory 1 and whose source terminal or drain terminal is not connected to any node) to the power source or the ground in order to eliminate the floating nodes. The floating nodes are on the paths through which the clock signal is propagated. The above circuit connection information contains the transistor information by which the logical gates such as the clock buffers are formed and the net information contains the parasitic resistances and the parasitic capacitors in the wires connected among the transistors. Thereby, it is possible to perform the simulation of the layout pattern including the transistors 111 and 112 whose source or drain terminal is the floating node and it is possible to reduce design time for the layout pattern of the semiconductor integrated circuit when compared with the simulation time that is necessary for the conventional simulation method performed by hands. Further, the clock analysis device of the eighth embodiment can eliminate the occurrences of mistakes by hands.

Ninth Embodiment

Figure 13:
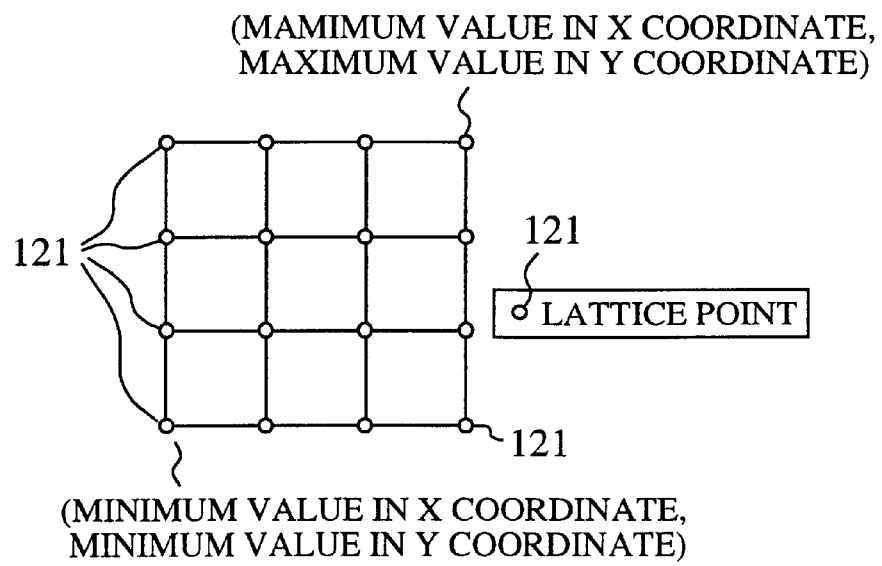
FIG. 13 is a diagram showing a two-dimensional distribution map of delay values and skew values obtained by the clock signal analysis device according to the ninth embodiment of the present invention.

FIG. 13 is a diagram showing a two-dimensional distribution map of delay values and skew values obtained by the clock signal analysis device according to the ninth embodiment of the present invention. The configuration of the clock signal analysis device according to the ninth embodiment is the same as that of the first embodiment, therefore the same reference numbers are used and the explanation for them is omitted here.

Next, a description will be given of the operation of the clock signal analysis device according to the ninth embodiment.

First, the pre processing section 4 in the clock signal analysis device 100 reads the circuit connection information stored in the memory 1 and obtains the minimum coordinate value and the maximum coordinate value in the coordinate information of all of nodes from the circuit connection information that have been red.

Next, the pre processing section 4 calculates virtual lattice points shown by the reference symbol "o" in FIG. 13 that are divided into equal lengths between the maximum coordinate point and the minimum coordinate point. The reference number 121 designates those virtual lattice points. The pre processing section 4 decides that nodes whose coordinate values are the nearest point to each lattice point are set as observation points.

Next, the simulation execution section 5 performs the simulation process. After the simulation, the after processing section 6 calculates delay values and skew values from the clock signal input node to the observation points. For example, after processing section 6 sorts the delay values and the skew values by 50 pico-seconds, the delay values and the skew values that have been sorted by 50 pico-seconds are classified by coloring color codes, and the classified delay and skew values are then displayed through the monitor 8. Thereby, the designers can observe the two-dimensional distribution map of the delay/skew values through the monitor 8.

As described above, according to the ninth embodiment of the present invention, the pre processing section 4 in the clock signal analysis device 100 obtains the minimum coordinate point and the maximum coordinate point in all of nodes based on the circuit connection information stored in the memory 1, and calculates lattice coordinate values of virtual lattice points that have been divided into equal parts between the maximum coordinate point and the minimum coordinate point, and decides that nodes whose coordinate values are the nearest point to each of the virtual lattice points are set as observation points. After the simulation process, the after processing section 6 sorts the delay values and the skew values from the clock signal input node to the observation points by an optional value by 50 pico-seconds, for example. The colored two-dimensional distribution map colored per level based on the coordinate values is displayed through the monitor 8. Thereby, the designers can observe this two-dimensional distribution map of the delay/skew values through the monitor 8. Because the designers can observe only the nodes that are nearest to the virtual lattice points, it is possible to reduce the amount of the resource to be used, and the designers can recognize a rough state of delay values and skew values that have been analyzed in the layout pattern of the semiconductor integrated circuit. Thereby, the present invention has the effect that the designers can easily narrow down the parts to be improved in the layout pattern of the semiconductor integrated circuit.

Tenth Embodiment

Figure 14:
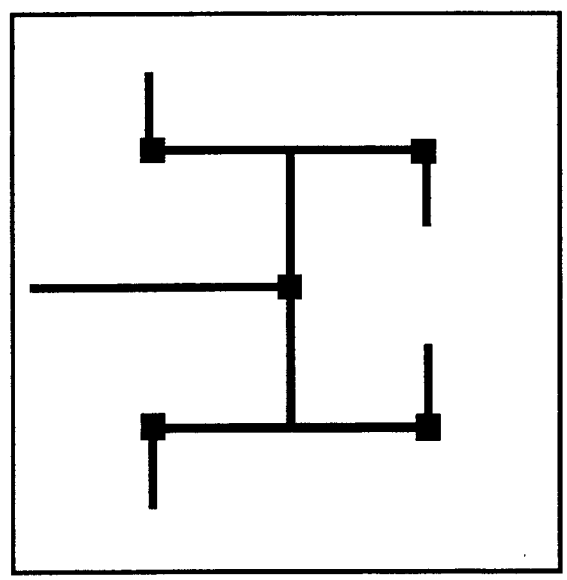
FIG. 14 is a diagram showing wiring paths obtained by the clock signal analysis device according to the tenth embodiment of the present invention.

FIG. 14 is a diagram showing wiring paths obtained by the clock signal analysis device according to the tenth embodiment of the present invention. The configuration of the clock signal analysis device according to the tenth embodiment is the same as that of the first embodiment, therefore the same reference numbers are used and the explanation for them is omitted here.

Next, a description will be given of the operation of the clock signal analysis device according to the tenth embodiment.

First, the pre processing section 4 in the clock signal analysis device 100 reads the circuit connection information stored in the memory 1, wiring paths from the clock signal input node to the clock signal termination node are obtained based on the circuit connection information and displayed by using the coordinate information of all nodes through the monitor 8, as shown in FIG. 14.

Next, the simulation execution section 5 performs the simulation by using the wiring paths obtained by the pre processing section 4 in order to calculate delay values and skew values. The calculated delay values and skew values are displayed through the monitor 8.

As described above, according to the tenth embodiment of the present invention, the pre processing section 4 in the clock signal analysis device 100 obtains the wiring paths from the clock signal input node to the clock signal terminal node by using the coordinate information of all nodes based on the circuit connection information stored in the memory 1 and displays the wiring paths, and also displays the delay values and the skew values calculated during the simulation process on the monitor 8. Thereby, the designers can obtain and easily recognize the information about the wiring path having the large delay value and the large skew value. The present invention has the effect to increase the design efficiency for the layout pattern of the semiconductor integrated circuit.

Eleventh Embodiment

Figure 15:
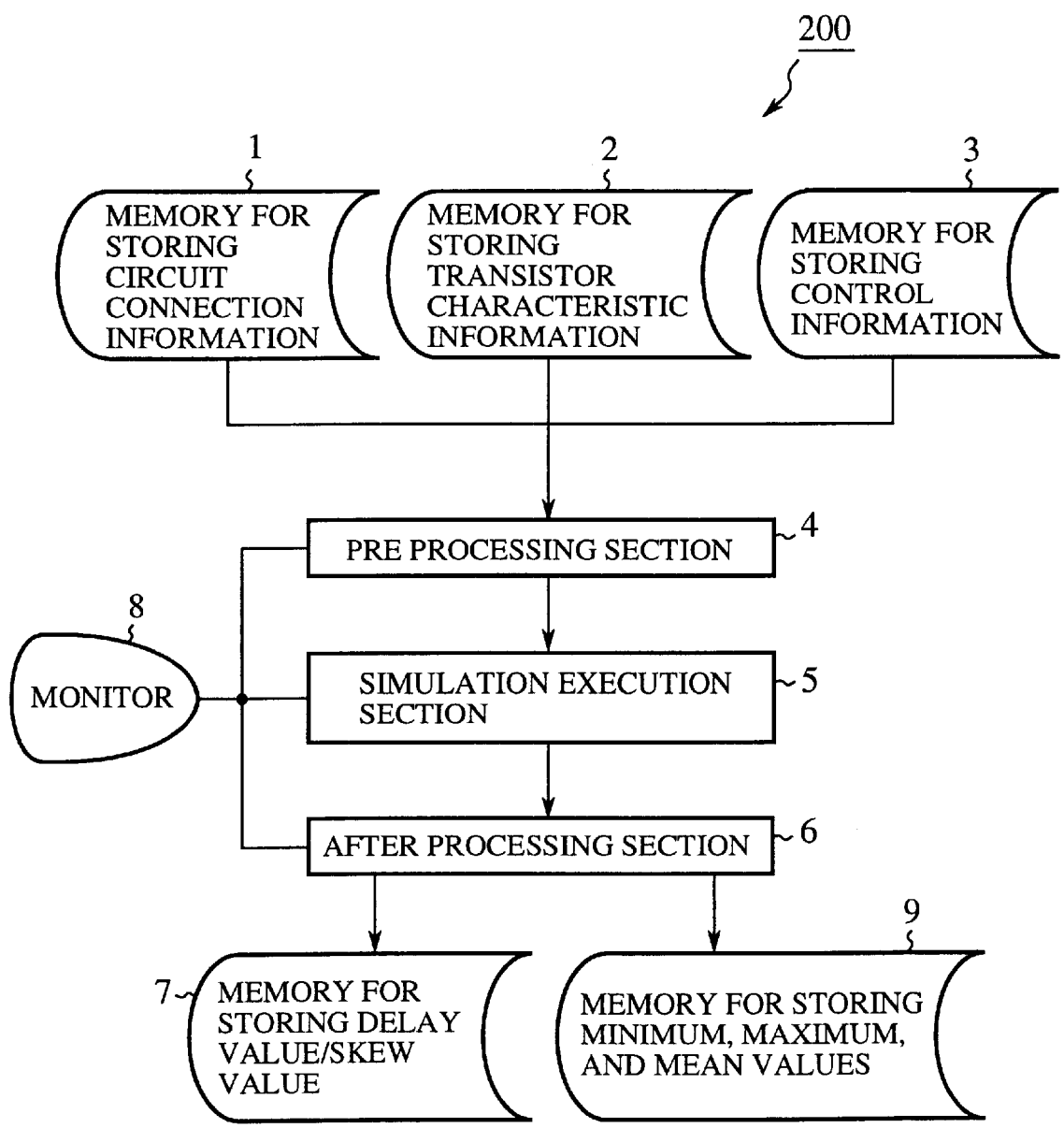
FIG. 15 is a block diagram showing a configuration of the clock signal analysis device according to the eleventh embodiment of the present invention.

FIG. 15 is a block diagram showing a configuration of the clock signal analysis device according to the eleventh embodiment of the present invention. In FIG. 15, the reference number 9 designates a memory for storing the minimum value, the maximum value, and the mean values in each of delay values, skew values, rising times, and falling times calculated by the after processing section 6. The reference number 200 denotes the clock signal analysis device according to the eleventh embodiment. Other configuration elements in the clock signal analysis device according to the eleventh embodiment are the same as those of the first embodiment, therefore the same reference numbers are used and the explanation for them is omitted here.

Next, a description will be given of the operation of the clock signal analysis device according to the eleventh embodiment.

First, the after processing section 6 in the clock signal analysis device 200 calculates the minimum value, the maximum value, and the mean values for each of delay values, skew values, rising times, and falling times and the calculation results are written into the memory 9.

As described above, because the after processing section 6 in the clock signal analysis device according to the eleventh embodiment of the present invention calculates the minimum value, the maximum value, the mean values for each of the delay values, the skew values, the rising times, and the falling times, and then writes those calculation results into the memory 9, the designers can analysis the transfer time of the clock signal efficiently based on the statistics (the calculation results) such as the minimum value, the maximum value, and the mean values stored in the memory 9. Because the skew value of the clock signal is preferably uniform and small in the semiconductor integrated circuit capable of performing at a high speed, the designers can obtain and observe the statistics such as the minimum value, the maximum value, and the mean values in each of the delay values, the skew values, the rising times, and the falling times. Thereby, it is possible to increase the efficiency of the design for the semiconductor integrated circuit.

Twelfth Embodiment

Figure 16:
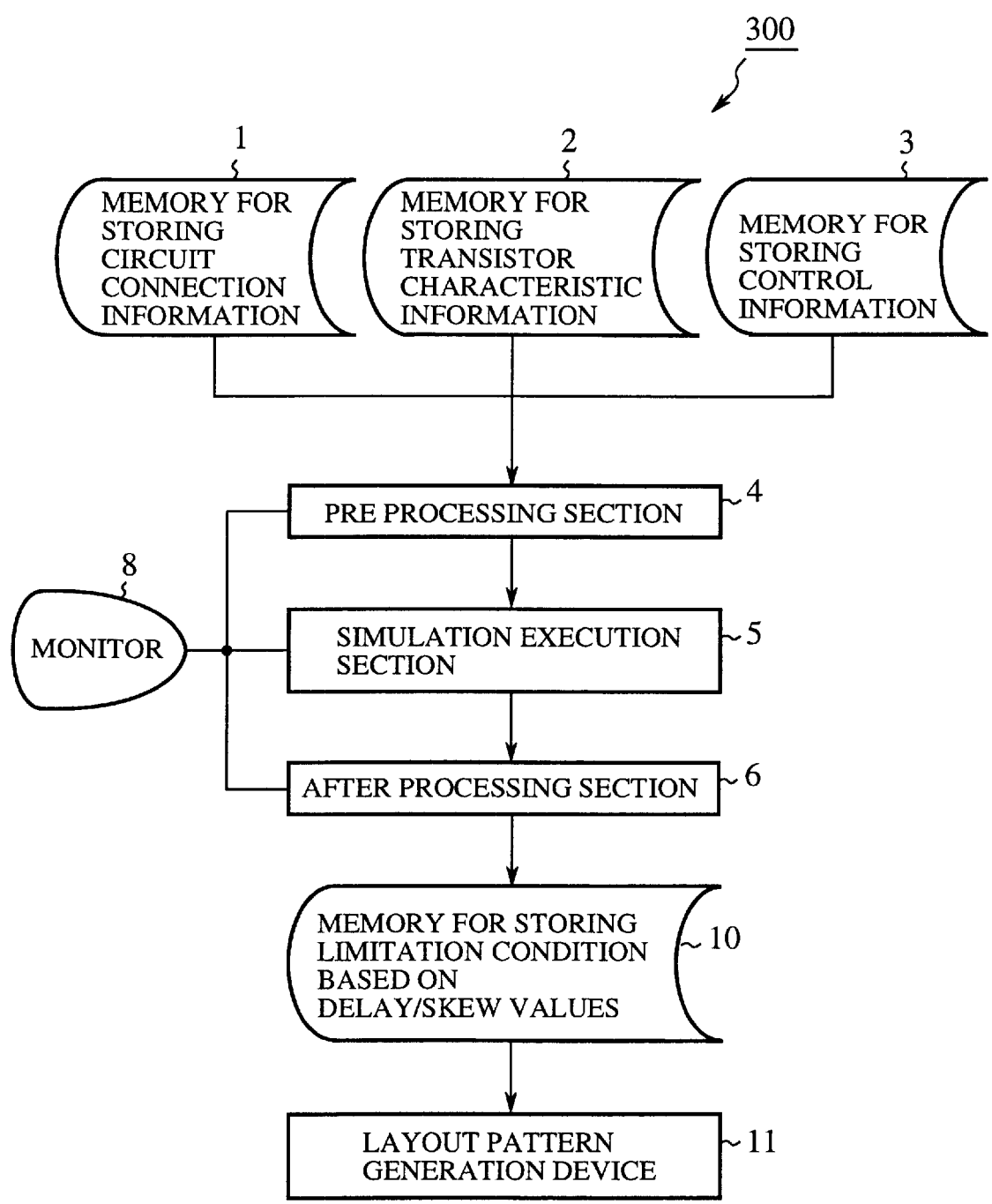
FIG. 16 is a block diagram showing a configuration of the clock signal analysis device according to the twelfth embodiment of the present invention.
Figure 17:
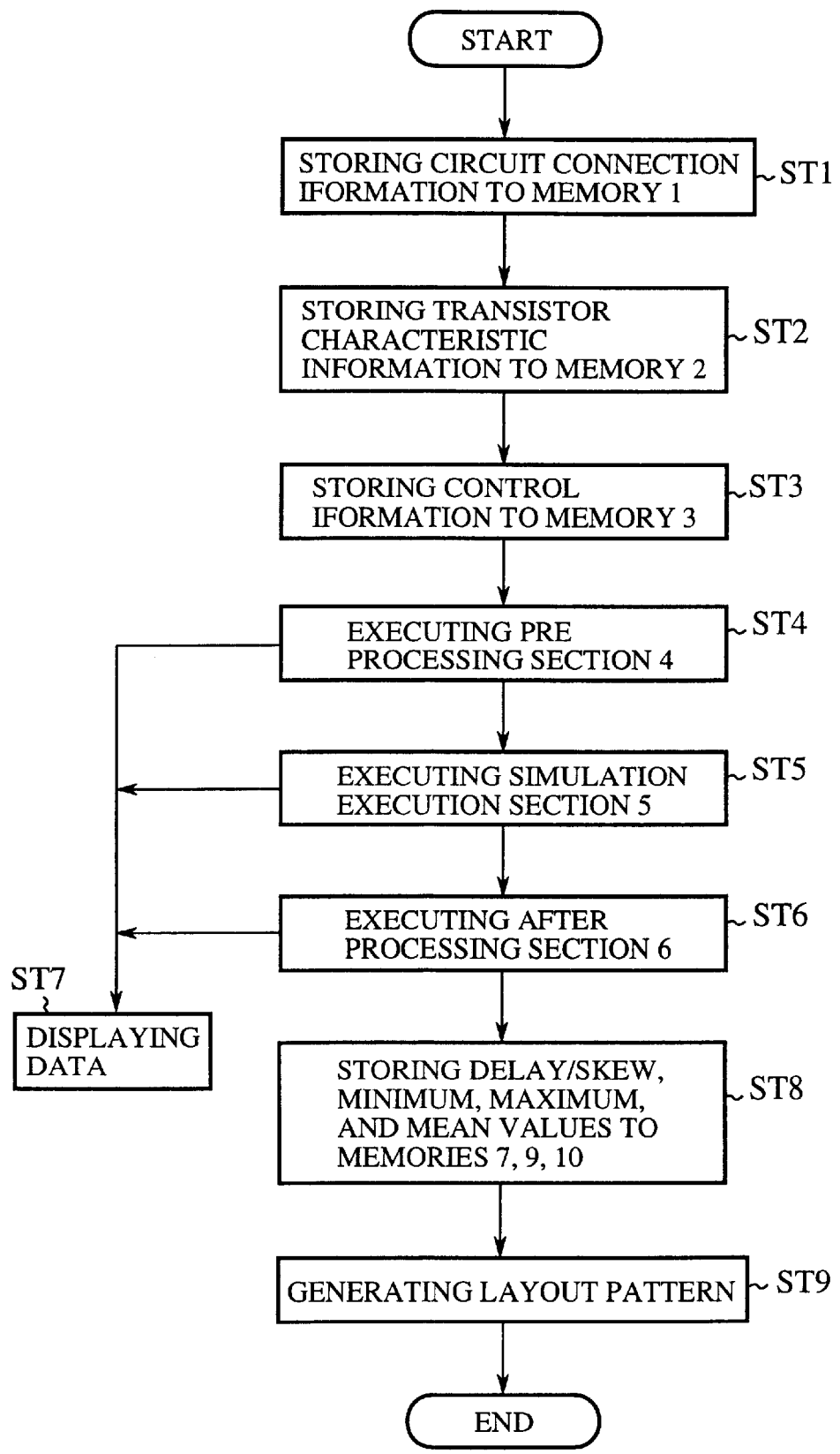
FIG. 17 is a flow chart showing the operation of the clock signal analysis device according to the twelfth embodiment of the present invention.

FIG. 16 is a block diagram showing a configuration of the clock signal analysis device according to the twelfth embodiment of the present invention. FIG. 17 is a flow chart showing the operation of the clock signal analysis device according to the twelfth embodiment of the present invention. In FIG. 16, the reference number 110 designates a memory for storing limitation conditions (Step ST8 shown in FIG. 17) that are obtained from the delay values and skew values. The reference number 11 indicates a layout generation pattern for generating a layout pattern (Step ST8 shown in FIG. 17) of a semiconductor integrated circuit based on the limitation conditions obtained form the delay values and the skew values. Other configuration elements in the clock signal analysis device 300 according to the twelfth embodiment are the same as those of the first embodiment, therefore the same reference numbers are used and the explanation for them is omitted here.

Next, a description will be given of the operation of the clock signal analysis device according to the twelfth embodiment.

The process of the steps ST1 to ST8 shown in FIG. 17 are the same of the steps described in the explanation of the first to eleventh embodiments.

First, in order to improve the delay values and the skew values in the clock signal propagation paths, the after processing section 6 generates limitation conditions for the layout pattern generation device 11 such as a clock tree generation device and an automatic arranging and wiring device (not shown) based on the delay values and the skew values of the clock signal propagation paths obtained by the steps ST6 and ST8 and writes those limitation conditions into the memory 10 (Step ST8).

Next, the layout pattern generation device 11 reads the limitation conditions stored on the memory 10, and then generates the layout pattern of the semiconductor integrated circuit based on the limitation conditions (Step ST9).

As described above, according to the twelfth embodiment of the present invention, the after processing section 6 performs the back annotation for the calculated delay values and the skew values to the layout pattern generation device 11 such as the clock signal tree generation device and the automatic arranging and wiring device in order to improve the delay values and the skew values in the clock signal propagation paths based on the delay values and the skew values in the clock signal propagation paths processed by the after processing section 6. Thereby, it is possible to directly use the analysis results of the delay values and the skew values in the improvement of the design for the layout pattern of the semiconductor integrated circuit.

Thirteenth Embodiment

Figure 18:
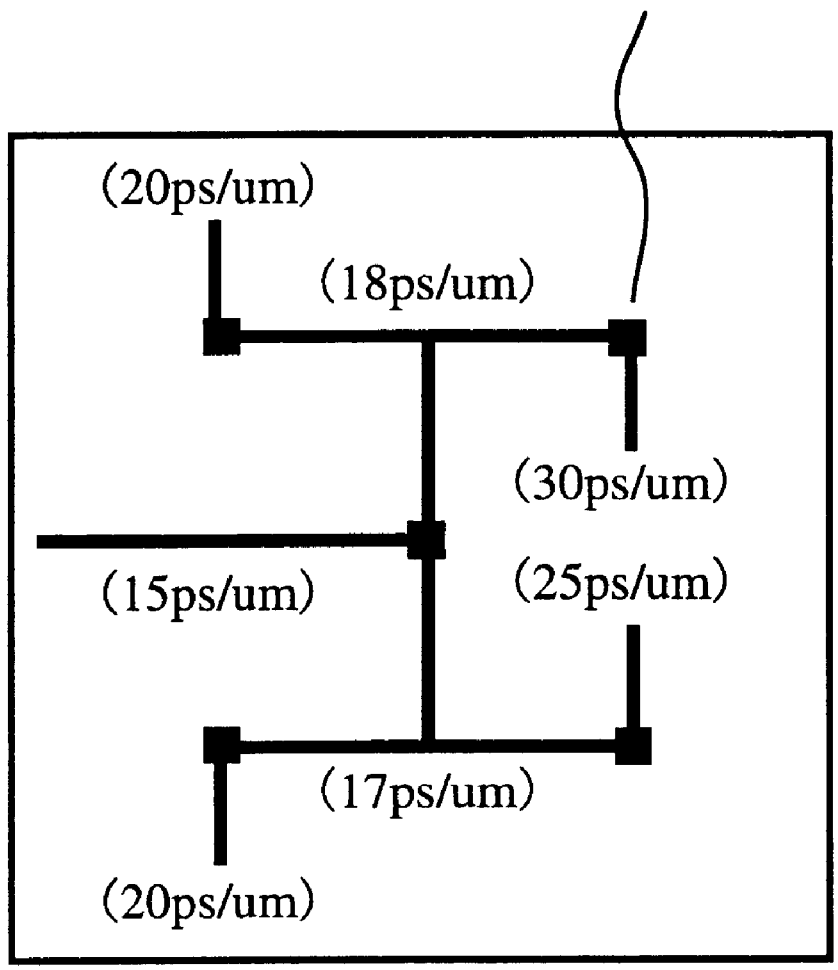
FIG. 18 is a diagram showing changes of delay values per length obtained by the clock signal analysis device according to the thirteenth embodiment of the present invention.

FIG. 18 is a diagram showing changes of delay values per length obtained by the clock signal analysis device according to the thirteenth embodiment of the present invention.

The configuration of the clock signal analysis device according to the thirteenth embodiment is the same as that of the twelfth embodiment shown in FIG. 16, therefore the same reference numbers are used and the explanation for them is omitted here.

Next, a description will be given of the operation of the clock signal analysis device according to the thirteenth embodiment.

First, the pre processing section 4 in the clock signal analysis device 300 decides all nodes in designated nets as observation points. Next, the simulation execution section 5 performs the simulation. After this simulation process, the after processing section 6 calculates a delay value per length for each parasitic resistance based on a difference between delay values, and coordinate values at both terminal nodes in each designated net. By using the calculation results, the after processing section 6 performs a path search processing for searching the connection information about the designated nets in order to detect a coordinate of the node where the delay value per length of the adjacent parasitic resistances is over a predetermined allowed value.

As described above, according to the thirteenth embodiment of the present invention, the pre processing section 4 in the clock signal analysis device decides all nodes in the designated nets as observation points, and the simulation execution section 5 performs the simulation, and the after processing section 6 calculates a delay value per length for each parasitic resistance based on a difference between delay values and coordinate values at both terminal nodes in each designated net. By using the calculation results, the after processing section 6 then performs the path search processing for searching the connection information about the designated nets in order to detect the coordinate of the node where the delay value per length of the adjacent parasitic resistances is over a predetermined allowed value. The designers can thereby easily detect positions in the designed layout pattern where the wiring width of one node is narrow than that of an adjacent node. As a result, when compared with the conventional simulation processing performed by hands, the clock signal analysis device of the thirteenth embodiment can reduce the design time of the layout pattern of the semiconductor integrated circuit and avoid any occurrence of mistakes caused by hands.

As described above, according to the present invention, the first memory means, the second memory means, and the third memory means in the clock signal analysis device store the circuit connection information including the parasitic resistances and the parasitic capacitors, the transistor characteristic information, and the control information, respectively. The pre processing means in the clock signal analysis device performs the path search in the layout pattern of the semiconductor integrated circuit in order to decide the position of the clock signal termination node by using the above information, and automatically detects the position of the clock signal termination node that requires the observation of the delay value and the skew value. When compared with the conventional method in which elements and floating nodes that are not required for the execution of the simulation are detected by hands, the present invention has the effect that it is possible to reduce the design time of the semiconductor integrated circuit and avoid any occurrence of mistakes caused by hands.

In addition, according to the present invention, the pre processing means in the clock signal analysis device searches and decides unnecessary transistors connected to the starting net, and then eliminates those unnecessary transistors from the circuit connection information, and shorts all of nodes that do not connect other circuit elements in order to automatically generate a clock signal input node. Further, the pre processing means makes connection information comprising the circuit connection information except the information about the parasitic resistances and the parasitic capacities, and displays a configuration of the logical gates in the clock signal propagation paths on the display means to designers. Furthermore, the pre processing means decides that gate terminals of transistors connected to a designated net are clock signal intermediate nodes based on the circuit connection information, and then calculates a delay value from the clock signal input node to the clock signal terminal node and a difference between the clock signal intermediate nodes, and replaces a transistor whose gate terminal is connected to the clock signal termination node with a capacitor placed between the clock signal termination node and a ground. Moreover, the pre processing means connects a gate terminal of a transistor that is not connected to any optional node to a power source or a ground in order to eliminate a floating node. Furthermore, the pre processing means connects a source terminal or a drain terminal of a transistor that is not connected to any optional node to a power source or a ground in order to eliminate a floating node. When compared with the conventional clock signal analysis device and method in which elements and floating nodes that are not required for the execution of the simulation are detected by hands, the present invention can reduce the design time of the semiconductor integrated circuit and avoid any occurrence of mistakes caused by hands.

Furthermore, according to the present invention, the pre processing means obtains the minimum coordinate and the maximum coordinate in coordinate information for all nodes involved in the circuit connection information, calculates virtual lattice points as virtual lattice coordinates by dividing a length between the minimum coordinate and the maximum coordinate into equal length, and decides nodes that are the nearest point to the virtual lattice points as observation points. After the completion of the simulation executed by the simulation execution means, the after processing means classifies delay values and skew values from the clock signal input node to the observation nodes per optional length, and then makes a two-dimensional distribution map by coloring color codes per optional length, and displays the two-dimensional distribution map through the display means to the designers. The present invention has the effect that it is possible to reduce the amount of the resource to be used, and the designers can recognize a rough state of the delay values and the skew values that have been analyzed in the layout pattern of the semiconductor integrated circuit. Thereby, the designers can easily narrow down the parts to be improved in the layout pattern of the semiconductor integrated circuit.

Moreover, according to the present invention, the after processing means in the clock signal analysis device obtains the wiring paths from the clock signal input node to the clock signal terminal node by using the coordinate information of all nodes and displays the wiring paths, and further displays the delay values and the skew values calculated during the simulation process on the display means. The present invention has the effect that the designers can obtain and easily recognize the information about the wiring paths having the large delay value and the large skew value, and the design efficiency for the layout pattern of the semiconductor integrated circuit can be increased.

In addition, according to the present invention, the after processing means in the clock signal analysis device calculates the minimum value, the maximum value, the mean values for each of the delay values, the skew values, the rising times, and the falling times, and then writes those calculation results into the fourth memory means. The present invention has the effect that the designers can analysis the transfer time of the clock signal efficiently based on the statistics (as the calculation results) such as the minimum value, the maximum value, and the mean values stored in the fourth memory means in order to efficiently analyses the propagation speed of the clock signal, and it is thereby possible to increase the efficiency of the design of the semiconductor integrated circuit.

Furthermore, according to the present invention, the after processing means in the clock signal analysis device performs the back annotation for the calculated delay and skew values to the layout pattern generation means such as the clock signal tree generation device and the automatic arranging and wiring device in order to improve the delay and skew values in the clock signal propagation paths based on the delay and skew values in the clock signal propagation paths processed by the after processing section. The present invention has the effect that it is thereby possible directly to use the analysis results of the delay values and the skew values in the improvement of the design for the layout pattern of the semiconductor integrated circuit.

Furthermore, according to the present invention, the pre processing section in the clock signal analysis device decides all nodes in the designated nets as observation points based on the circuit connection information stored in the first memory means, and the simulation execution means performs the simulation, and the after processing section calculates a delay value per length for each parasitic resistance based on a difference between delay values and coordinate values at both terminal nodes in each designated net. By using the calculation results, the after processing section then performs the path search process for searching the connection information about the designated nets in order to detect the coordinate of the node where the delay value per length of the adjacent parasitic resistances is over a predetermined allowed value. The designers can thereby easily detect positions in the designed layout pattern where the width of the wiring at one node is narrow than that of adjacent nodes. As a result, when compared with the conventional simulation processing performed by hands, the clock signal analysis device of the present invention can reduce the design time of the layout pattern of the semiconductor integrated circuit and avoid any occurrence of mistakes caused by hands.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A clock signal analysis device comprising:
   first memory means for storing circuit connection information including transistor information and net information, said transistor information comprising logical gates including clock buffers and said net information comprising parasitic resistances and parasitic capacities of wires among transistors to be used during analysis for delay/skew values in clock signal propagation paths in a semiconductor integrated circuit;
   second memory means for storing transistor characteristic information to be used during a simulation for circuit operation of said semiconductor integrated circuit;
   third memory means for storing control information to be used for controlling an execution of said analysis of delay/skew values;
   pre-processing means for inputting said circuit connection information stored in said first memory means, said transistor characteristic information stored in said second memory means, said control information stored in said third memory means, and for editing said circuit connection information, said transistor characteristic information, and said control information;
   simulation execution means for inputting said edited information transferred from said pre-processing means and for executing said simulation of circuit operation of said semiconductor integrated circuit by using a circuit simulator and a switch level simulator; and
   after-processing means for inputting simulation results transferred from said simulation execution means, and for calculating a delay value of each clock signal terminal node from each clock signal input node, a skew value as a difference between delay values of clock signal terminal nodes, a rising time of said clock signal, and a falling time of said clock signal, and for transferring said calculated delay values, said skew values, said rising time, and said falling time as simulation analysis results in order to display said simulation analysis results on display means,
   wherein said pre-processing means edits said circuit connection information into an usable state for said simulation, and said after-processing means displays said simulation analysis results executed by said simulation means on a two-dimensional distribution map through said display means.

2. A clock signal analysis device according to claim 1, wherein said pre-processing means makes connection information comprising said circuit connection information other than said parasitic resistances and said parasitic capacities based on said circuit connection information including said transistor information comprising said logical gates including clock buffers and said net information comprising said parasitic resistances and said parasitic capacities of said wires among said transistors stored in said first memory means, and determines all of clock signal terminal nodes by searching a clock signal propagation path from a starting net to which said clock signal is inputted to a following net in order through logical gates including inverters, clocked inverters, and optional logical gates.

3. A clock signal analysis device according to claim 1, wherein said pre-processing means searches and determines unnecessary transistors connected to starting net in said circuit connection information including said transistor information comprising said logical gates including clock buffers and said net information comprising said parasitic resistances and said parasitic capacities of said wires among said transistors stored in said first memory means, and then eliminates said unnecessary transistors from said circuit connection information, and
   wherein said pre-processing means shorts all of nodes that do not connect other circuit elements in order to generate a clock signal input node.

4. A clock signal analysis device according to claim 1, wherein said pre-processing means makes connection information comprising said circuit connection information other than said parasitic resistances and said parasitic capacities based on said circuit connection information including said transistor information comprising said logical gates including clock buffers and said net information comprising said parasitic resistances and said parasitic capacities of said wires among said transistors stored in said first memory means, and displays a configuration of said logical gates in said clock signal propagation paths on said display means.

5. A clock signal analysis device according to claim 1, wherein said pre-processing means determines if gate terminals of transistor connected to a designated net are clock signal intermediate nodes based on said circuit connection information including said transistor information comprising said logical gates including clock buffers and said net information comprising said parasitic resistances and said parasitic capacities of said wires among said transistors stored in said first memory means, and said pre-processing means then calculates a delay value from said clock signal input node to said clock signal terminal node, and a difference between said clock signal intermediate nodes.

6. A clock signal analysis device according to claim 1, wherein in said circuit connection information including said transistor information comprising said logical gates including clock buffers and said net information comprising said parasitic resistances and said parasitic capacities of said wires among said transistors stored in said first memory means, said pre-processing means replaces a transistor whose gate terminal is connected to said clock signal termination node with a capacitor located between said clock signal termination node and a ground.

7. A clock signal analysis device according to claim 1, wherein in said circuit connection information including said transistor information comprising said logical gates including clock buffers and said net information comprising said parasitic resistances and said parasitic capacities of said wires among said transistors stored in said first memory means, said pre-processing means connects a gate terminal of a transistor that is not connected to any optional node to a power source or a ground in order to eliminate a floating node.

8. A clock signal analysis device according to claim 1, wherein in said circuit connection information including said transistor information comprising said logical gates including clock buffers and said net information comprising said parasitic resistances and said parasitic capacities of said wires among said transistors stored in said first memory means, said pre-processing means connects a source terminal or a drain terminal of a transistor that is not connected to any optional node to a power source or a ground in order to eliminate a floating node.

9. A clock signal analysis device according to claim 1, wherein said pre-processing means obtains a minimum coordinate and a maximum coordinate in coordinate information for all nodes involved in said circuit connection information, calculates virtual lattice points as virtual lattice coordinates by dividing a length between said minimum coordinate and said maximum coordinate into equal length, and decides nodes that are the nearest point to said virtual lattice points as observation points, and pre-processing means classifies delay values and skew values from said clock signal input node to said observation nodes per optional length, and then makes a two-dimensional distribution map by coloring color codes per optional length, and displays said two-dimensional distribution map through said display means in order to reduce an amount of a used resource during a simulation for said nodes having said coordinates that are the nearest nodes to said virtual lattice points.

10. A clock signal analysis device according to claim 1, wherein said pre-processing means displays said clock signal propagation paths of said wiring from said clock signal input node to said clock signal termination nodes by using all of coordination information through said display means.

11. A clock signal analysis device according to claim 1, further comprises a fourth memory, wherein said after-processing means writes a minimum value, a maximum value, a mean value of each of calculated delay values, skew values, rising time, and falling time, and statistic results of these values into said fourth memory means.

12. A clock signal analysis device according to claim 11, further comprises layout pattern generation means, wherein said layout pattern generation means receives delay values and skew values that have been calculated in order to improve said delay values and said skew values in said clock signal propagation paths based on said minimum value, said maximum value, and said mean value of each of said delay values, said skew values, said rising time, and said falling time stored in said fourth memory means by said after-processing means, and wherein said layout pattern generation means generates a layout pattern of said semiconductor integrated circuit based on delay value and skew value that have been back annotated.

13. A clock signal analysis device according to claim 1, wherein said pre-processing means determines all of nodes involved in a designated net as observation nodes based on said circuit connection information including said transistor information comprising said logical gates including clock buffers and said net information comprising said parasitic resistances and said parasitic capacities of said wires among said transistors stored in said first memory means, and wherein said after-processing means calculates a delay value per unit length for each of said parasitic resistances based on a difference of said delay values between both terminal nodes of said designated net and coordinate values of said both terminal nodes, searches said connection information along clock signal propagation paths in said designated net involved in said circuit connection information, checks and extracts coordinates at which said delay value per unit length of said parasitic resistance is changed over an optional allowed value, and displays said extracted coordinates through said display means.

14. A clock signal analysis method comprising the steps of:

a first memory step for storing circuit connection information including transistor information and net information, said transistor information comprising logical gates including clock buffers and said net information comprising parasitic resistances and parasitic capacities of wires among transistors to be used during analysis for delay/skew values in clock signal propagation paths in a semiconductor integrated circuit;

a second memory step for storing transistor characteristic information to be used during a simulation for circuit operation of said semiconductor integrated circuit;

a third memory step for storing control information to be used for controlling an execution of said analysis of delay/skew values;

a pre-processing step for inputting said circuit connection information, said transistor characteristic information, said control information, and for editing said circuit connection information, said transistor characteristic information, and said control information;

a simulation execution step for inputting said edited information obtained from said pre-processing step and for executing said simulation of circuit operation of said semiconductor integrated circuit by using a circuit simulator and a switch level simulator; and an after-processing step for inputting simulation results obtained from said simulation execution step, and for calculating a delay value of each clock signal terminal node from each clock signal input node, a skew value as a difference between delay values of clock signal terminal nodes, a rising time of said clock signal, and a falling time of said clock signal, and for transferring said calculated delay values, said skew values, said rising time, and said falling time as simulation analysis results in order to display said simulation analysis results, wherein said pre-processing step edits said circuit connection information into an usable state for aid simulation, and said after-processing step displays said simulation analysis results obtained by said simulation step on a two-dimensional distribution map through a display step.

15. A clock signal analysis method according to claim 14, further comprising the steps of:

a fourth memory step for storing a minimum value, a maximum value, a mean value of each of said delay values, said skew values, said rising time and said falling time, and statistic results of these values, and a layout pattern generation step for generating a layout pattern of said semiconductor integrated circuit based on said information obtained from said fourth memory step in order to improve said delay values and said skew values of said clock signal propagation paths based on said delay values and said skew values that have been back annotated.

* * * * *